US012616068B2

(12) United States Patent
Huang et al.

(10) Patent No.: US 12,616,068 B2
(45) Date of Patent: Apr. 28, 2026

(54) LIGHT EMITTING MODULE AND DISPLAY APPARATUS

(71) Applicant: SEOUL SEMICONDUCTOR (SHENZHEN) CO., LTD., Shenzhen (CN)

(72) Inventors: Xifeng Huang, Shenzhen (CN); Yi Li, Shenzhen (CN); Jeonggon Kim, Shenzhen (CN)

(73) Assignee: SEOUL SEMICONDUCTOR (SHENZHEN) CO., LTD., Ansan-si (KR)

( * ) Notice: Subject to any disclaimer, the term of this patent is extended or adjusted under 35 U.S.C. 154(b) by 472 days.

(21) Appl. No.: 18/170,292

(22) Filed: Feb. 16, 2023

(65) Prior Publication Data

US 2023/0268325 A1 Aug. 24, 2023

(30) Foreign Application Priority Data

Feb. 18, 2022 (CN) .......................... 202210151918.0

(51) Int. Cl.
*H01L 25/075* (2006.01)
*G02F 1/13357* (2006.01)
(52) U.S. Cl.
CPC .... *H01L 25/0753* (2013.01); *G02F 1/133603* (2013.01); *G02F 1/133605* (2013.01)
(58) Field of Classification Search
CPC ........... H01L 25/0753; G02F 1/133603; G02F 1/133605; H10H 20/856
See application file for complete search history.

(56) References Cited

U.S. PATENT DOCUMENTS

| | | | | | |
|---|---|---|---|---|---|
| 6,069,597 | A | * | 5/2000 | Hansen | G09G 3/22 |
| | | | | | 345/98 |
| 6,888,529 | B2 | * | 5/2005 | Bruning | H05B 45/385 |
| | | | | | 345/82 |
| 8,469,575 | B2 | * | 6/2013 | Weber | G02B 27/286 |
| | | | | | 362/624 |
| 8,740,442 | B2 | * | 6/2014 | Weber | G02B 5/3083 |
| | | | | | 362/624 |
| 9,153,732 | B2 | * | 10/2015 | Oraw | H05B 45/20 |
| 9,572,222 | B2 | * | 2/2017 | Oraw | H05B 45/20 |
| 9,661,716 | B2 | * | 5/2017 | Oraw | H05B 45/20 |
| 12,300,771 | B2 | * | 5/2025 | Zhang | H10H 20/855 |

(Continued)

FOREIGN PATENT DOCUMENTS

| | | | | | |
|---|---|---|---|---|---|
| CN | 101253813 | A | * | 8/2008 | H05B 45/48 |
| CN | 101253813 | B | * | 12/2010 | H05B 45/48 |

(Continued)

OTHER PUBLICATIONS

Search Report from corresponding European Patent Application No. 23157321.3 dated Jul. 14, 2023, (9 pages).

*Primary Examiner* — Laura M Menz
(74) *Attorney, Agent, or Firm* — Perkins Coie LLP

(57) ABSTRACT

The present disclosure provides a light emitting module and a display apparatus. A light emitting module according to an embodiment includes a bar-shaped circuit board; a plurality of light emitting devices disposed on the circuit board; and a reflection wall surrounding the light emitting devices, in which the plurality of light emitting devices is divided into at least two strings, and each of the strings includes light emitting devices connected in series.

7 Claims, 9 Drawing Sheets

(56) References Cited

U.S. PATENT DOCUMENTS

| | | | | |
|---|---|---|---|---|
| 12,336,328 B2 * | 6/2025 | Li | | H10H 20/8131 |
| 12,379,625 B2 * | 8/2025 | Ran | | G02F 1/1336 |
| 2005/0157515 A1 * | 7/2005 | Chen | | H05B 45/40 |
| | | | | 362/555 |
| 2007/0046485 A1 * | 3/2007 | Grootes | | H05B 45/3725 |
| | | | | 340/815.45 |
| 2010/0165660 A1 * | 7/2010 | Weber | | G02F 1/13362 |
| | | | | 362/613 |
| 2013/0128549 A1 * | 5/2013 | Weber | | G02B 5/305 |
| | | | | 362/97.1 |
| 2013/0221368 A1 * | 8/2013 | Oraw | | H05B 45/20 |
| | | | | 257/89 |
| 2014/0240981 A1 * | 8/2014 | Weber | | G02B 6/0096 |
| | | | | 362/235 |
| 2015/0070890 A1 * | 3/2015 | Okano | | F21V 19/002 |
| | | | | 362/235 |
| 2015/0366025 A1 * | 12/2015 | Oraw | | H05B 45/20 |
| | | | | 315/294 |
| 2015/0373809 A1 * | 12/2015 | Oraw | | H05B 45/20 |
| | | | | 315/210 |
| 2020/0003392 A1 * | 1/2020 | Kang | | F21K 9/68 |
| 2022/0352416 A1 * | 11/2022 | Li | | H10H 20/8131 |
| 2022/0376149 A1 * | 11/2022 | Zhang | | H10H 20/8506 |
| 2023/0215848 A1 * | 7/2023 | Cho | | G09F 9/3026 |
| | | | | 257/79 |
| 2023/0268325 A1 * | 8/2023 | Huang | | G02F 1/133605 |
| | | | | 257/79 |
| 2025/0035982 A1 * | 1/2025 | Ran | | G02F 1/133606 |
| 2025/0189848 A1 * | 6/2025 | Guo | | G02F 1/133605 |
| 2025/0248175 A1 * | 7/2025 | Li | | H10H 20/812 |
| 2025/0267992 A1 * | 8/2025 | Zhang | | H01L 25/0753 |

FOREIGN PATENT DOCUMENTS

| | | | | | |
|---|---|---|---|---|---|
| CN | 202405255 U | * | 8/2012 | | |
| CN | 102959708 A | * | 3/2013 | | F21V 5/10 |
| CN | 102959708 B | * | 5/2016 | | F21V 5/10 |
| CN | 105870312 A | * | 8/2016 | | H01L 24/83 |
| CN | 105870312 B | * | 1/2020 | | H01L 23/4985 |
| CN | 116666371 A | * | 8/2023 | | H10H 20/856 |
| EP | 3587897 B1 | * | 4/2021 | | F21K 9/68 |
| EP | 4231348 A1 | * | 8/2023 | | H10H 20/856 |
| JP | 2000214825 A | * | 8/2000 | | H05B 45/37 |
| JP | 2007066897 A | * | 3/2007 | | H05B 45/48 |
| KR | 1020130032095 A | | 1/2013 | | |
| KR | 10188671 B1 | | 8/2018 | | |
| TW | I794311 B | * | 3/2023 | | H05B 33/02 |
| WO | WO-2007023454 A1 | * | 3/2007 | | H05B 45/48 |
| WO | WO-2023128732 A1 | * | 7/2023 | | G09F 9/3026 |

* cited by examiner

100

10

20L     20R 5270
5250
5230
5210
5190
5170
5130
5100

5110    5150

5150
5130
5100

LIGHT EMITTING MODULE AND DISPLAY APPARATUS

CROSS-REFERENCE TO RELATED APPLICATIONS

This application claims priority to and benefit of Chinese Application No. 202210151918.0, filed on Feb. 18, 2022. The entire contents of the aforementioned application is incorporated by reference as part of the disclosure of this document.

TECHNICAL FIELD

The present disclosure relates to a light emitting module and a display apparatus.

BACKGROUND

Light emitting diodes are inorganic semiconductor devices, and are used in various technical fields such as displays, automobile lamps, and general lighting and the like. The light emitting diodes are used as backlight light sources in display apparatuses such as televisions and the like.

The backlight light source is generally classified into a direct type or an edge type. The edge-type backlight light source generally includes a light emitting module including a long bar-shaped circuit board and light emitting devices arranged in a row on the circuit board, and the light emitting devices may include light emitting diodes and phosphors.

The light emitting devices in the light emitting module may be connected in series to one another and operated together. However, when a large number of light emitting devices are connected in series, a driving voltage may be excessively high and may not be operated at a commercial voltage. Furthermore, as a high driving voltage is applied, the light emitting module is easily damaged.

SUMMARY

Exemplary embodiments provide an improved light emitting module configured to lower a driving voltage of a light emitting module for backlight.

Exemplary embodiments provide a method of classifying light emitting modules to conveniently assemble a display apparatus.

A light emitting module according to an embodiment of the present disclosure includes a bar-shaped circuit board; a plurality of light emitting devices disposed on the circuit board; and a reflection wall surrounding the light emitting devices, in which the plurality of light emitting devices is divided into at least two strings, and each of the strings includes light emitting devices connected in series.

A reflection wall surrounding light emitting devices in one string may be spaced apart from a reflection wall surrounding light emitting devices in another string.

Furthermore, each of the reflection walls may include a plurality of grooves, and at least two light emitting devices may be disposed in each of the grooves.

A height of the reflection wall may be greater than those of the light emitting devices.

A thickness of a reflection wall disposed between the light emitting devices in one string may be greater than that of a reflection wall disposed between adjacent strings.

Meanwhile, a distance between the reflection wall disposed between the adjacent strings and the light emitting device may be smaller than a distance between the reflection wall disposed between the light emitting devices in one string and the light emitting device.

The at least two strings may be connected in parallel to one another.

A display apparatus according to an embodiment of the present disclosure includes a display panel; and a backlight source providing light to the display panel, in which the backlight source includes a plurality of light emitting modules disposed near one side surface of the display panel, and each of the plurality of light emitting modules includes a bar-shaped circuit board; a plurality of light emitting devices disposed on the circuit board; and a reflection wall surrounding the light emitting devices, in which the plurality of light emitting devices is divided into at least two strings, and each of the strings includes light emitting devices connected in series.

The at least two strings may be connected in parallel to each other.

A method for classifying light emitting modules according to an embodiment of the present disclosure is a method for classifying light emitting modules two or more of which constitute a light source as a set, in which each of the light emitting modules includes a plurality of strings, and each of the strings includes light emitting devices connected in series, and the method for classifying light emitting modules includes steps of (a) setting an acceptable maximum forward voltage difference for a forward voltage difference of strings in one set as a required spec dvf, (b) assigning a minimum value and a maximum value of the forward voltages to each of the light emitting modules by measuring the forward voltages of strings of each of the light emitting modules, (c) selecting target light emitting modules to be classified through the measured forward voltages, (d) determining a smallest forward voltage and a largest forward voltage as a first reference minimum value ($1^{st}$ Prime Min; $1^{st}$ PMn) and a first reference maximum value ($1^{st}$ Prime Max; $1^{st}$ PMx), respectively, among the forward voltages of all strings of the target light emitting modules, (e) for light emitting modules in which each of the minimum value and maximum value assigned to the light emitting modules are within a range of the first reference minimum value and a value obtained by adding the first reference minimum value and the required spec dvf, classifying them into a main class and an auxiliary class, in which the main class is assigned to light emitting modules that may constitute a set, and the auxiliary class is assigned to light emitting modules that may not constitute a set, (f) for light emitting modules in which each of the minimum value and the maximum value assigned to the light emitting modules are within a range of the first reference maximum value and a value obtained by subtracting the required spec dvf from the first reference maximum value, classifying them into a main class and an auxiliary class, in which the main class is assigned to light emitting modules that may constitute a set, and the auxiliary class is assigned to light emitting modules that may not constitute a set, and (g) repeating the steps (d), (e), and (f) excluding the light emitting modules assigned to the main classes in the steps (e) and (f).

The target light emitting modules are light emitting modules in which a difference between the minimum value and the maximum value of the forward voltages does not exceed the required spec dvf.

In some embodiments, the step (f) may be performed before the step (e).

Repeating the steps (d), (e), and (f) may be performed until a main class is assigned to all light emitting modules that may constitute a set.

At least one of the light emitting modules may be assigned one or more auxiliary classes along with one main class.

Once the main class is assigned to all light emitting modules constituting a set, at least one of the light emitting modules not assigned the main class that may constitute a set may be assigned a plurality of auxiliary classes.

A minimum value and a maximum value of forward voltages of strings in the light emitting module not assigned the main class that may constitute a set may be greater than the first reference minimum value and less than the first reference maximum value, respectively.

A method for classifying light emitting modules according to another embodiment of the present disclosure is a method for classifying light emitting modules two or more of which constitute a light source as a set, in which each of the light emitting modules includes a plurality of strings, and each of the strings includes light emitting devices connected in series, and the method for classifying light emitting modules includes steps of (a) setting an acceptable maximum forward voltage difference for a forward voltage difference of strings in one set as a required spec dvf, (b) assigning a minimum value and a maximum value of the forward voltages to each of the light emitting modules by measuring the forward voltages of strings of each of the light emitting modules, (c) selecting target light emitting modules to be classified through the measured forward voltages, (d) determining a smallest forward voltage as a first reference minimum value ($1^{st}$ Prime Min; $1^{st}$ PMn) among the forward voltages of all strings of the target light emitting modules, (e) determining a largest forward voltage a first reference maximum value ($1^{st}$ Prime Max; $1^{st}$ PMx) among the forward voltages of all strings of the target light emitting modules, (f) for light emitting modules in which each of the minimum value and maximum value assigned to the light emitting modules are within a range of the first reference minimum value and a value obtained by adding the first reference minimum value and the required spec dvf, classifying them into a main class and an auxiliary class, in which the main class is assigned to light emitting modules that may constitute a set, and the auxiliary class is assigned to light emitting modules that may not constitute a set, and (g) for light emitting modules in which each of the minimum value and maximum value assigned to the light emitting modules are within a range of the first reference maximum value and a value obtained by subtracting the required spec dvf from the first reference maximum value, classifying them into a main class and an auxiliary class, in which the main class is assigned to light emitting modules that may constitute a set, and the auxiliary class is assigned to light emitting modules that may not constitute a set, The method for classifying light emitting modules may repeat the steps (d), (e), (f), and (g) excluding the light emitting modules to which the main class is assigned in the steps (f) and (g).

In some embodiments, the steps (d) and (f) may be performed at least once before performing the step (g) excluding the light emitting modules to which the main class is assigned in the step (f).

In some embodiments, the step (g) may be performed before the step (f).

Furthermore, the steps (e) and (g) may be performed at least once before performing the step (f) excluding the light emitting modules to which the main class is assigned in the step (g).

DETAILED DESCRIPTION

Figure 1:
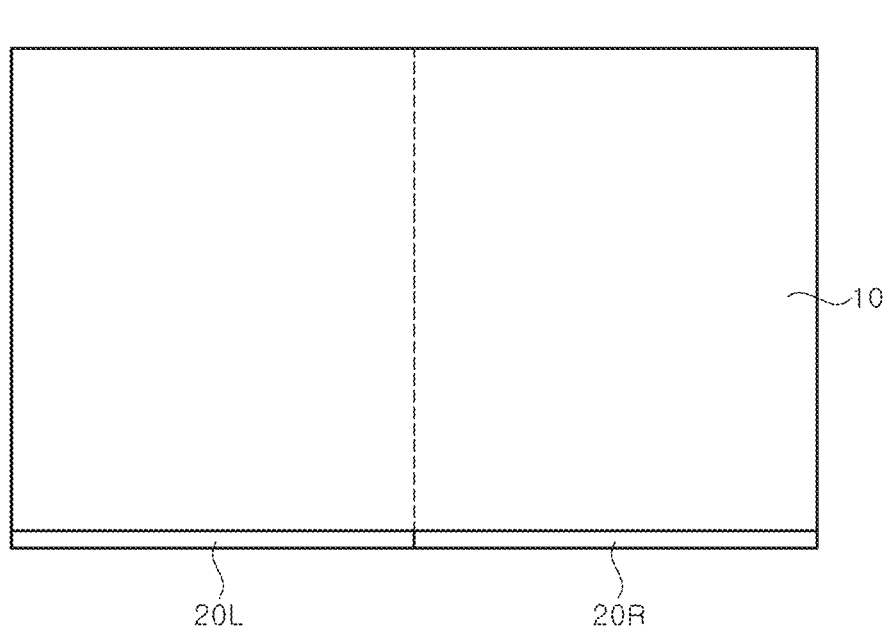
FIG. 1 is a schematic plan view illustrating a display apparatus according to an embodiment of the present disclosure.

Hereinafter, exemplary embodiments of the present disclosure will be described in detail with reference to the accompanying drawings. The following exemplary embodiments are provided by way of example. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

FIG. 1 is a schematic plan view illustrating a display apparatus according to an embodiment of the present disclosure.

Referring to FIG. 1, a display apparatus 100 may include a display panel 10 and light emitting modules 20L and 20R. The display apparatus 100 may also include a well-known light guide plate and various optical films.

The display panel 10 may display images using liquid crystal. The display panel 10 may have a rectangular shape elongated in one direction, and may be divided into left and right regions based on a central dotted line.

The light guide plate may be disposed under the display panel 10, and the light emitting modules 20L and 20R may be disposed on side surfaces of the light guide plate. A left light emitting module 20L and a right light emitting module 20R constitute a backlight light source as a set. In this embodiment, it is described that the left light emitting module 20L and the right light emitting module 20R are disposed on one side of the display panel 10, but the light emitting modules are not limited to one side of the display panel 10, and may be disposed on opposite two sides or all four sides.

The left light emitting module 20L and the right light emitting module 20R may be disposed on a side surface of the display panel 10, and may be disposed to provide light to left and right regions of the display panel 10, respectively.

In this embodiment, a plurality of light emitting modules 20L and 20R constitute the backlight source as a set.

Different light emitting modules 20L and 20R are not connected in series to one another. For example, light emitting devices 23 in the left light emitting module 20L and light emitting devices 23 in the right light emitting module 20R may be connected in parallel, and thus, it is possible to lower a driving voltage for driving the light emitting modules 20L and 20R.

Figure 2:
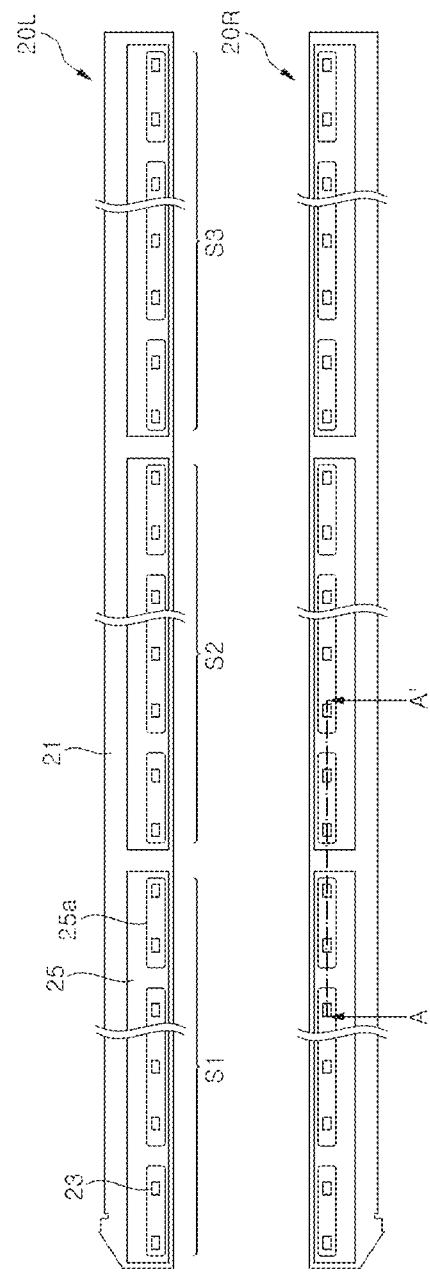
FIG. 2 is a schematic plan view illustrating a left light emitting module and a right light emitting module.
Figure 3:
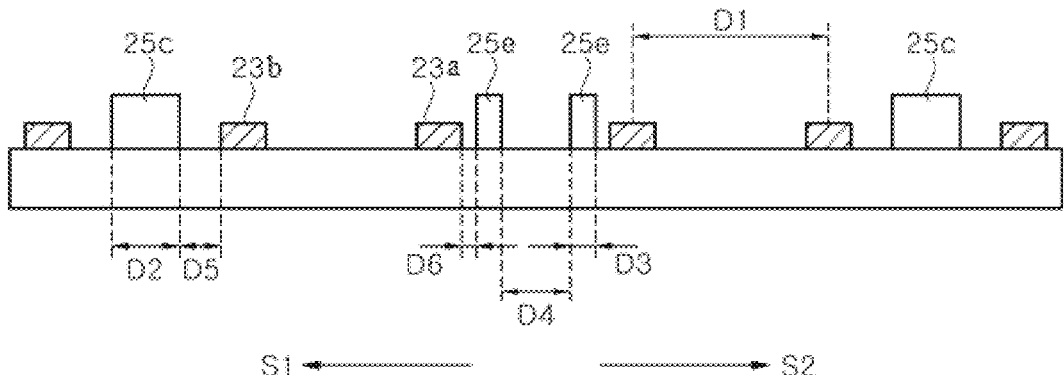
FIG. 3 is a schematic cross-sectional view taken along line A-A' of FIG. 2 to describe a light emitting module.
Figure 4:
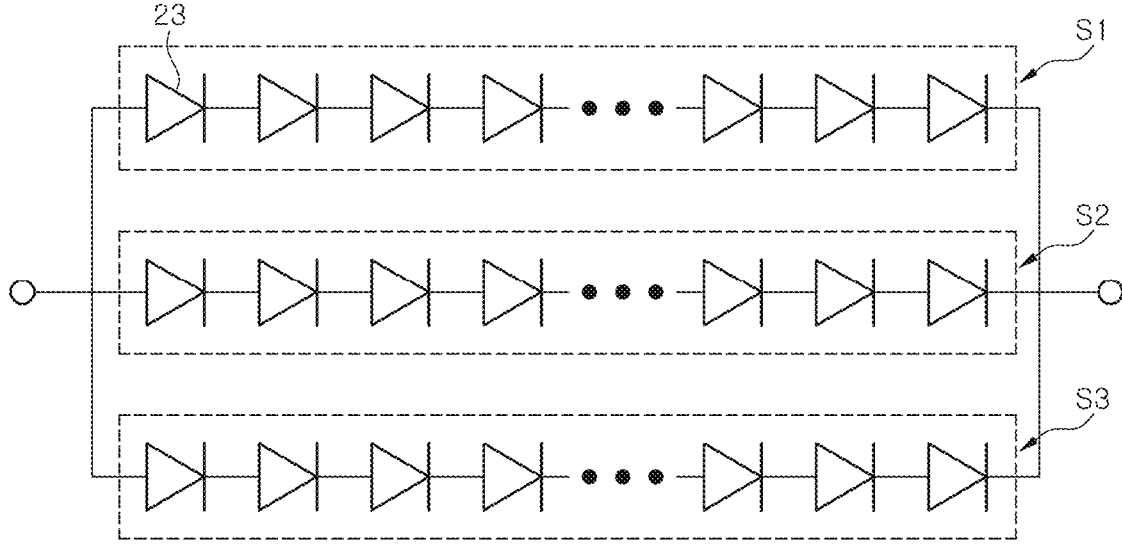
FIG. 4 is a schematic circuit diagram illustrating a light emitting module.

In the implementations, each of the light emitting modules 20L and 20R includes light emitting devices 23 divided into a plurality of strings, which will be described in detail with reference to FIGS. 2, 3, and 4. In this specification, the term "string" means a group of light emitting devices connected in series. FIG. 2 is a schematic plan view illustrating the left light emitting module 20L and the right light emitting module 20R, FIG. 3 is a schematic cross-sectional view taken along line A-A' of FIG. 2 to describe the light emitting module, and FIG. 4 is a schematic circuit diagram illustrating the light emitting module.

Referring to FIG. 2, the left light emitting module 20L and the right light emitting module 20R may include a circuit board 21, the light emitting devices 23, and a reflection wall 25. The left light emitting module 20L and the right light emitting module 20R may be mirror plane symmetrical to each other as shown in FIG. 2, but other implementations are also possible.

The circuit board 21 may include a circuit for supplying power to the light emitting devices 23. As shown in FIG. 2, the circuit board 21 may have a long bar shape.

The light emitting devices 23 are mounted on the circuit board 21. The light emitting devices 23 may be arranged in a line on the circuit board 21. Intervals between the light emitting devices 23 may be substantially equal to one another.

The light emitting devices 23 in the light emitting modules 20L and 20R are grouped into a plurality of strings S1, S2 and S3. Each of the strings S1, S2, and S3 includes a plurality of light emitting devices 23 connected in series. As shown in FIG. 4, the strings S1, S2, and S3 may be connected in parallel to one another. In this embodiment, three strings S1, S2, and S3 are described as being disposed in each of the light emitting modules 20L and 20R, but other implementations are also possible. For example, two strings or four or more strings may be disposed.

The driving voltage of the light emitting modules 20L and 20R may be further reduced by grouping the light emitting devices 23 in the light emitting modules 20L and 20R into the strings S1, S2 and S3, and connecting these strings S1, S2 and S3 in parallel.

The reflection wall 25 surrounds the light emitting devices 23. The reflection wall 25 may be formed of or include a reflective material such as white silicone. As shown in FIG. 2, the reflection wall 25 may have grooves 25a surrounding the plurality of light emitting devices 23. For example, the plurality of light emitting devices 23 are disposed in corresponding grooves 25a of the reflection wall 25. Two or more light emitting devices 23 may be disposed in each of the grooves 25a. A height of the reflection wall 25 may be greater than those of the light emitting devices 23, and thus, the light emitting devices 23 are disposed inside each of the grooves 25a.

The reflection wall 25 may surround the light emitting devices 23 in units of each of the strings S1, S2, and S3. In the example, a reflection wall 25 surrounding a first string S1 may be spaced apart from a reflection wall 25 surrounding a second string S2, and the reflection wall 25 surrounding the second string S2 may be spaced apart from a reflection wall 25 surrounding a third string S3. As shown in FIGS. 2 and 3, the reflection wall 25 in each string has portions 25c disposed between two adjacent grooves and portions 25e disposed at the edge of each string. In the example of FIG. 3, two portions 25c of the reflection wall 25 disposed between two adjacent grooves in which light emitting devices are disposed and two portions 25e of the reflection walls 25 of the two strings S1 and S2 reflection walls 25e are shown.

Portions of a reflection wall 25 formed between the grooves 25a in each string may have different thicknesses from one another. For example, as shown in FIG. 3, a thickness D2 of the portion 25c of the reflection wall 25 disposed between the grooves 25a in the string S1 may be greater than a thickness D3 of the portion 25e of the reflection wall 25 disposed at the edge of the strings S1. Furthermore, a distance D4 between the portions 25e of the reflection walls 25 of the strings S1 and S2 may be greater than the thickness D2 of the portion 25c of the reflection wall disposed between the grooves 25a in each of the strings S1 and S2.

In the implementations, a distance D6 is defined between the portion 25e of the reflection wall 25 of the string S1 and the light emitting device 23a that is disposed closest to the portion 25e in the string S1. The light emitting device 23a is disposed in a groove 25a together with the light emitting device 23b. A distance D5 is defined between the portion 25c of the reflection wall of the string S1 and the light emitting device 23b. The distance D6 may be smaller than the distance D5. Accordingly, it is possible to prevent a dark portion from being generated between the string S1. Although some description above regarding the thickness of various portions of the reference wall 25 is provided with reference to the string S1, the description above can be applied to other strings, for example, the strings, S2 and S3, and additional strings, if any.

According to this embodiment, one display apparatus 100 includes the plurality of light emitting modules 20L and 20R, and each of the light emitting modules 20L and 20R includes the plurality of strings S1, S2 and S3. Each of the strings S1, S2, and S3 includes the light emitting devices 23 connected in series, and the plurality of strings S1, S2, and S3 is connected in parallel to one another. In addition, the light emitting devices 23 in the light emitting modules 20L and 20R may be connected in parallel to one another or driven independently of one another. Accordingly, a driving voltage of the light emitting devices 23 may be lowered.

In some implementations, the backlight source needs to provide uniform light to the display panel 10 to make a screen's brightness uniform. To this end, forward voltages Vf of the strings S1, S2, and S3 in the plurality of light emitting modules 20L and 20R should be included within a required voltage range, and moreover, a forward voltage difference between the strings S1, S2, and S3 should satisfy an acceptable range, for example, a required spec dvf. For example, a maximum forward voltage difference between the strings S1, S2, and S3 in each of the left light emitting module 20L and the right light emitting module 20R should be within the required spec dvf, for example, 1.5V, and a maximum forward voltage difference between the strings S1, S2, and S3 in the left light emitting module 20L and the strings S1, S2, and S3 in the right light emitting module 20R should also be within the required spec dvf, for example, 1.5V. Although the maximum forward voltage difference is 1.5V as an example, the spec dvf for the maximum forward voltage difference may vary depending on the number of light emitting devices 23 included in each of the strings, and may also vary depending on a desired product's performance. Furthermore, it is described that the maximum forward voltage difference between the strings S1, S2, and S2 is 1.5V, but the forward voltage difference between the light emitting devices 23 disposed in a same number in the grooves 25a of the reflection wall 25 may also be 1.5V or less. For example, a maximum difference between a forward voltage of two light emitting devices 23 in one groove 25a and a forward voltage of two light emitting devices 23 in another groove 25a may be 1.5V or less. In addition, a maximum difference between a forward voltage of three light emitting devices 23 in one groove 25a and a forward voltage of three light emitting devices 23 in another groove 25a may be 1.5V or less.

In general, the left light emitting modules 20L and the right light emitting modules 20R are manufactured together in large quantities, the light emitting modules 20L and 20R having a similar performance are classified into a same class, and the light emitting modules of the same class may be packaged together. Left light emitting module 20L and right light emitting module 20R may be arbitrarily selected from the light emitting modules 20L and 20R packaged together and assembled into the display apparatus 100. Accordingly, no matter which of the light emitting modules of the same class are selected, the required spec dvf should be satisfied.

Groups that are similar to one another, that is, light emitting modules satisfying the required spec for the forward voltage difference need to be classified into a same class. As a general classification method, the forward voltages of each of the strings of all the light emitting modules 20L and 20R manufactured in large quantities and stocked are measured, and the light emitting modules 20L and 20R that satisfy the required spec are classified in an order of forward voltages, and thereafter, a same number of left light emitting modules 20L and right light emitting modules 20R are packaged together within each class.

However, the number of left light emitting modules 20L and the number of the right light emitting modules 20R may be inconsistent within each class, and therefore, the left light emitting modules 20L and the right light emitting modules 20R may be mismatched to constitute a set, so that the number of remaining light emitting modules may be considerably large. Furthermore, when the strings S1, S2, and S3 in the light emitting module are included in different classes, a problem that they cannot be included in any class may occur.

Hereinafter, a method of classifying light emitting modules two or more of which form a light source as a set according to an embodiment of the present disclosure will be described in detail. According to embodiments of the present disclosure, a classification method configured to reduce a discrepancy between the number of the left light emitting modules 20L and the number of the right light emitting modules 20R is provided.

Figure 5:
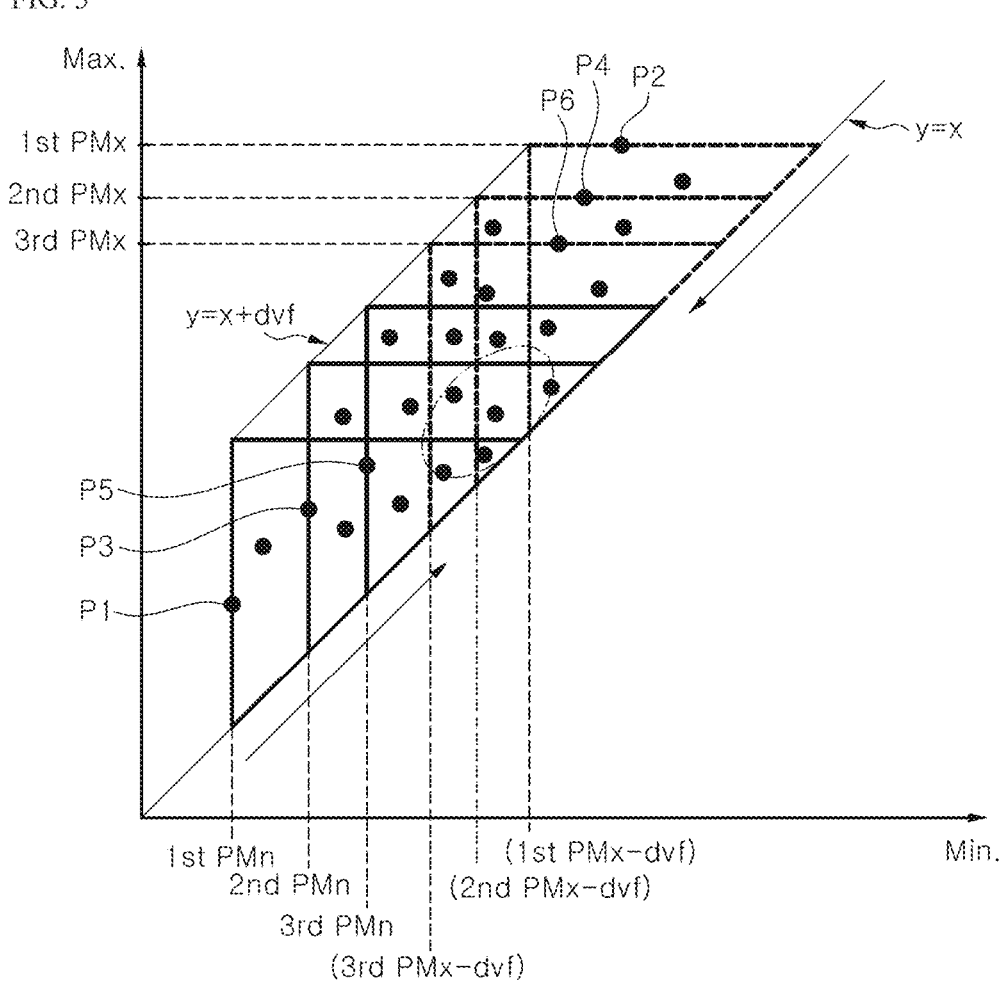
FIG. 5 is a graph illustrating a classification method of light emitting modules according to an embodiment of the present disclosure.
Figure 6:
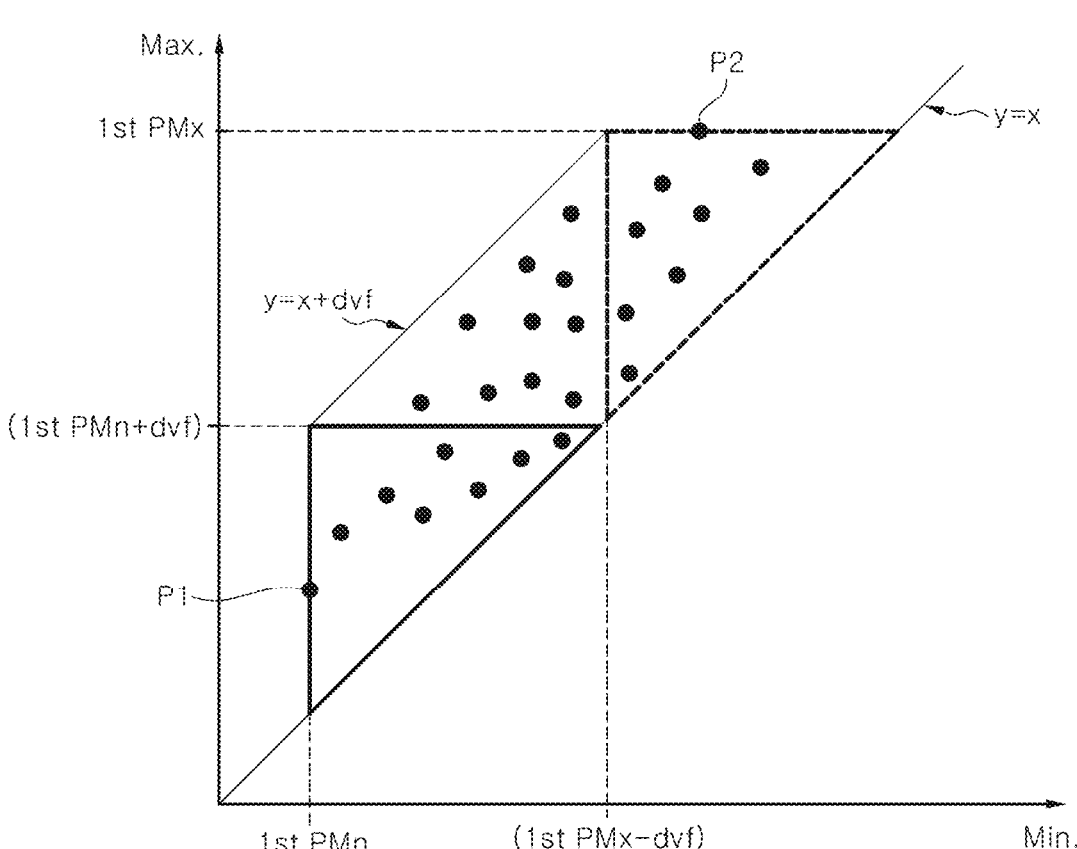
FIGS. 6 through 8 are graphs illustrating a classification method of light emitting modules according to an embodiment of the present disclosure.
Figure 7:
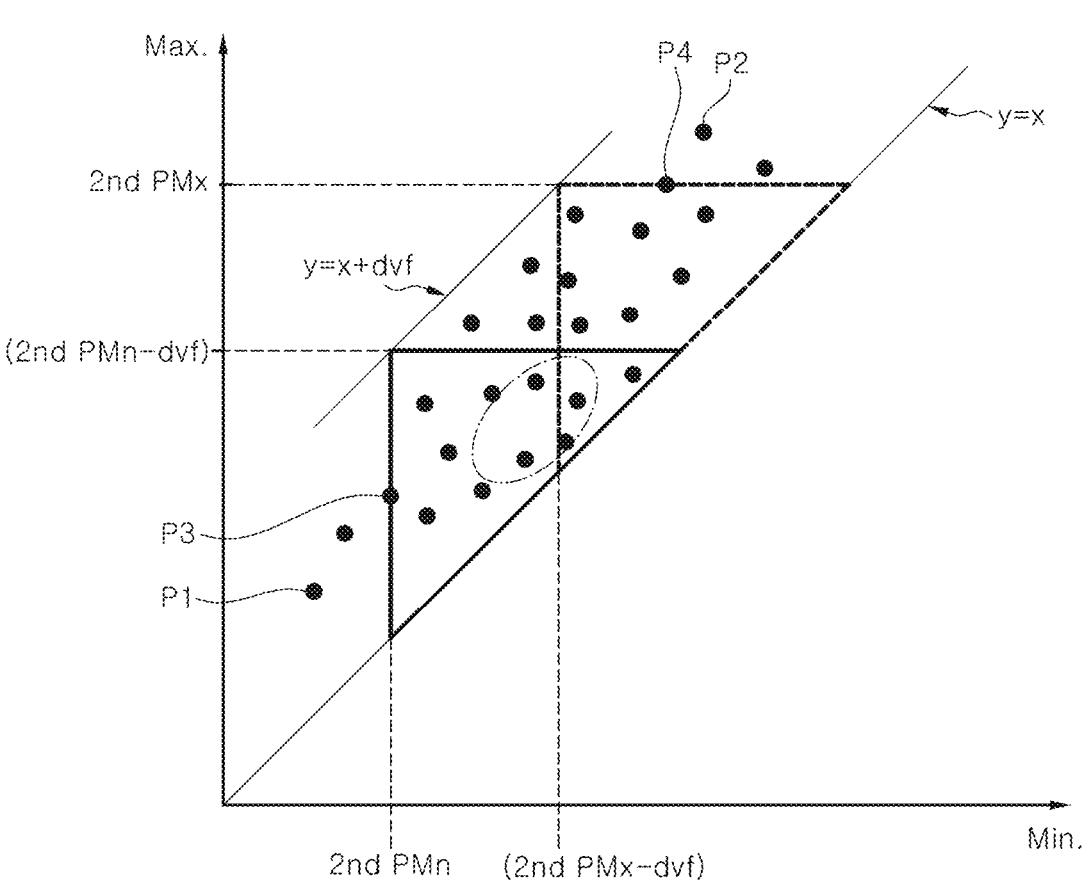
Figure 8:
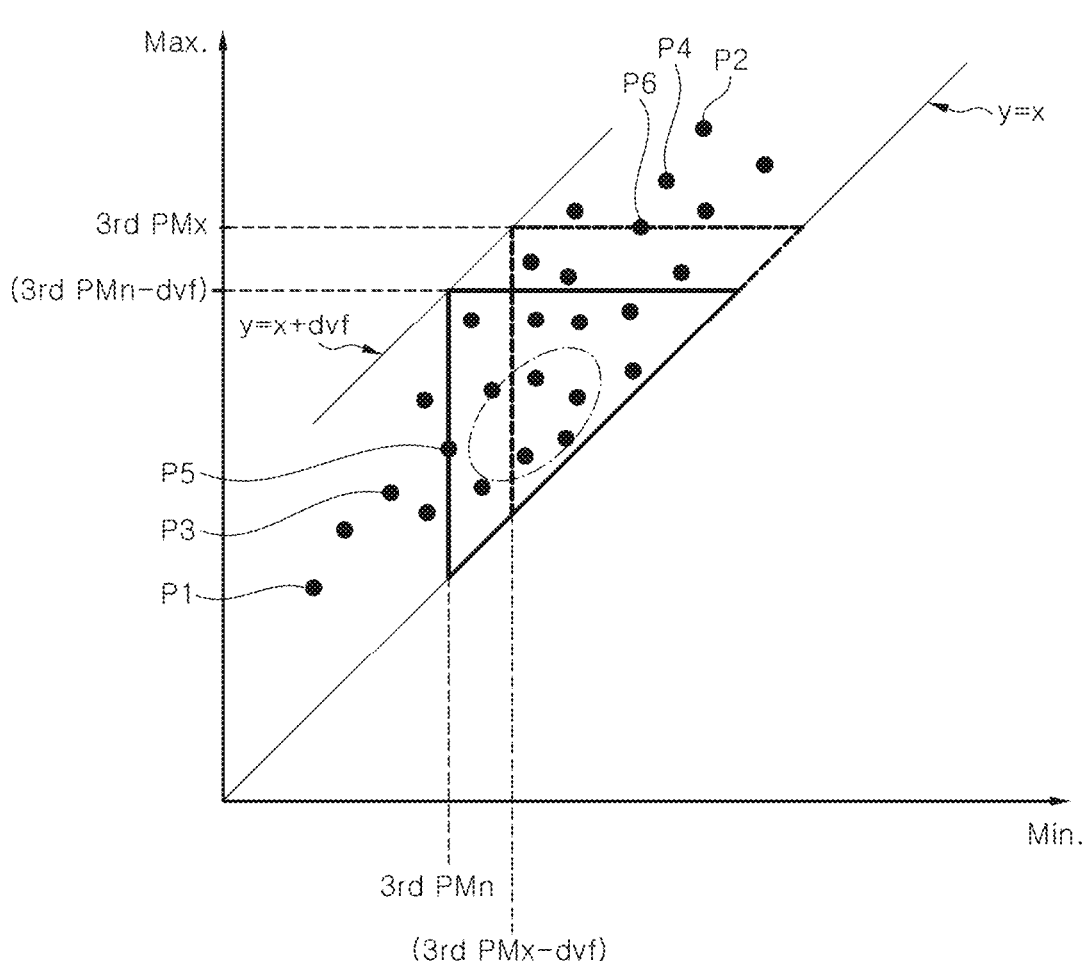

FIG. 5 is a graph illustrating a classification method of light emitting modules according to an embodiment of the present disclosure, and FIGS. 6 through 8 are graphs illustrating the classification method of the light emitting modules according to an embodiment of the present disclosure step by step.

A plurality of strings S1, S2, and S3 are included in each of light emitting modules 20L and 20R, and forward voltages for each of the strings are measured. Accordingly, minimum forward voltages Min and maximum forward voltages Max are determined for each of the light emitting modules. In a case that a difference between the minimum forward voltage and the maximum forward voltage is out of a required spec, a light emitting module will be determined to be defective and discarded. Accordingly, light emitting modules that satisfy the required spec are primarily selected.

The minimum forward voltage Min and the maximum forward voltage Max of the light emitting modules satisfying the spec may be represented as x and y coordinates in the graph, respectively, and FIG. 5 shows coordinates of some of the light emitting modules. For example, each of 500 or more left light emitting modules 20L and right light emitting modules 20R may be stocked, and (x, y) coordinates thereof may be displayed in the graph.

A line marked y=x in the graph of FIG. 5 indicates that minimum values and maximum values of the strings in the light emitting module are same. That is, in a case that all strings are the same, the coordinate value thereof will be located on the line indicated by y=x. Meanwhile, in the graph of FIG. 5, y=x+dvf indicates that differences between the minimum values and the maximum values of the strings in the light emitting modules are equal to the required spec dvf. That is, the maximum value is equal to the minimum value plus the required spec.

The classification method of light emitting modules of the present disclosure uses a mixture of upward classification and downward classification, as indicated by arrows in FIG. 5, and uses a method in which a last class is located in a central region of a coordinate distribution, for example, in an ellipse portion indicated by a dotted line.

The classification method of the light emitting modules according to an embodiment of the present disclosure will be described in detail below with reference to FIGS. 6 through 8 together with FIG. 5.

As described above, the forward voltages of each of the strings S1, S2, and S3 are measured for all light emitting modules that are stocked. The forward voltage Vf may be measured under a constant current. Light emitting modules in which the differences between the minimum forward voltages Min and the maximum forward voltages Max of the plurality of strings S1, S2, and S3 of each of the light emitting modules are greater than the required spec dvf are removed, and light emitting modules 20L and 20R that satisfy the required spec are selected as target modules for packaging.

Referring to FIGS. 5 and 6, a smallest forward voltage and a largest forward voltage among the forward voltages Vf of entire strings S1, S2, and S3 of the target light emitting modules 20L and 20R are determined as a first reference minimum value 1st PMn and a first reference maximum value 1st PMx, respectively. As shown in FIGS. 5 and 6, a smallest minimum value among the minimum values of the forward voltages becomes the first reference minimum value $1^{st}$ PMn, and a largest maximum value among the maximum values of the forward voltages becomes the first reference maximum value $1^{st}$ PMx. In FIG. 6, a minimum value of coordinates P1 becomes the first reference minimum value, and a maximum value of coordinates P2 becomes the first reference maximum value.

(Classification of a Main First Class and an Auxiliary First Class)

Coordinates in which the minimum values of the forward voltages of the strings are within a range of the first reference minimum value $1^{st}$ PMn and a value obtained by adding the first reference minimum value to the required spec dvf, and the maximum values of the forward voltages of the strings are within the range of the first reference minimum value $1^{st}$ PMn and the value obtained by adding the first reference minimum value to the required spec dvf are classified as a first class. This is expressed in an equation as follows:

$$<1^{st} \text{ PMn}, 1^{st} \text{ PMn+dvf}>.$$

In this specification, <u, v> encompasses all coordinate values where both x and y values are between u and v in a x-y coordinate system. That is, $<1^{st}$ PMn, $1^{st}$ PMn+dvf> indicates a range in which x and y are located between the first reference minimum value $1^{st}$ PMn and a value $1^{st}$ PMn+dvf obtained by adding the first reference minimum value $1^{st}$ PMn and the required spec dvf. A coordinate range indicated by the above equation has a square shape, but since the maximum value is greater than the minimum value in a same light emitting module, it may be displayed as a right triangle region indicated by a thick line in FIG. 6, and light emitting modules within this triangle range are classified as the first class. The light emitting modules within this triangular range may be packaged together since a difference between the minimum value and the maximum value in any combination of the left light emitting module 20L and the right light emitting module 20R does not exceed the required spec dvf. For convenience, a triangle including the first class light emitting modules is referred to as a first class triangle.

A same number of left light emitting modules 20L and right light emitting modules 20R may be included in the first class triangle, or they may be included in different numbers. In a case that the same number of left light emitting modules 20L and right light emitting modules 20R are included in the first class triangle, they may constitute a set together in the first class triangle and packaged together, and may be all classified as a main first class.

Meanwhile, in a case that different numbers of left light emitting modules 20L and right light emitting modules 20R are included in the first class triangle, an additional quantity of a larger number of light emitting modules among the left light emitting modules 20L and the right light emitting modules 20R are taken. The additional quantity of light emitting modules may be taken from light emitting modules having relatively large minimum values after the minimum values are aligned. Remaining light emitting modules excluding this additional quantity of light emitting modules may be classified as the main first class and packaged together, and this additional quantity of light emitting modules may be classified as an auxiliary first class. The light emitting modules classified as the main first class may constitute a set within the first class triangle, whereas the light emitting modules classified as the auxiliary first class have a same performance as those classified as the main first class, but cannot constitute a set because they are not matched within the first class triangle as there are no other light emitting modules that can be paired with them.

A next classification is performed for the remaining light emitting modules excluding the light emitting modules classified as the main first class. The light emitting modules classified as the auxiliary first class are also included as target light emitting modules in the next classification.
(Classification of a Main Second Class and an Auxiliary Second Class)

Light emitting modules that have the minimum and maximum values of the forward voltages of the strings are between a value $1^{st}$ PMx−dvf obtained by subtracting the required spec dvf from the first reference maximum value $1^{st}$ PMx and the first reference maximum value $1^{st}$ PMx are classified into a second class. This is expressed in an equation as follows:

$$<1^{st} \text{ PMx−dvf}, 1^{st} \text{ PMx}>.$$

A coordinate range indicated by the above equation has a square shape, but since the maximum value is greater than the minimum value in a same light emitting module, it may be displayed as a right triangle region indicated by a dotted line in FIG. 6, and light emitting modules within this triangle range are classified as the second class. The light emitting modules within this triangular range may be packaged together since a difference between the minimum value and the maximum value in any combination of the left light emitting module 20L and the right light emitting module 20R does not exceed the required spec dvf. For convenience, a triangle including the second class light emitting modules is referred to as a second class triangle.

A same number of left light emitting modules 20L and right light emitting modules 20R may be included in the second class triangle, or they may be included in different numbers. In a case that the same number of left light emitting modules 20L and right light emitting modules 20R are included in the above second class triangle, they may all constitute a set and packaged together, and may be all classified as a main second class.

Meanwhile, in a case that different numbers of left light emitting modules 20L and right light emitting modules 20R are included in the second class triangle, an additional quantity of a larger number of light emitting modules among the left light emitting modules 20L and the right light emitting modules 20R is taken. The additional quantity of light emitting modules may be taken from light emitting modules having relatively small maximum values after the maximum values are aligned. Remaining light emitting modules excluding this additional quantity of light emitting modules may be classified as the main second class and packaged together, and this additional quantity of light emitting modules may be classified as an auxiliary second class. The light emitting modules classified as the main second class may constitute a set within the second class triangle, but the light emitting modules classified as the auxiliary second class cannot constitute a set because they are not matched within the second class triangle.

A next classification is performed for the remaining light emitting modules excluding the light emitting modules classified as the main second class. The light emitting modules classified as the auxiliary second class are also included as target light emitting modules in the next classification.
(Classification of a Main Third Class and an Auxiliary Third Class)

Excluding the main first class light emitting modules, a smallest forward voltage among forward voltages Vf of entire strings S1, S2, and S3 of the target light emitting modules 20L and 20R is determined as a second reference minimum value $2^{nd}$ PMn. As shown in FIGS. 5 and 7, a minimum value of coordinates P3 becomes the second reference minimum value $2^{nd}$ PMn. The second reference minimum value $2^{nd}$ PMn may be a smallest minimum value among the minimum values of the auxiliary first class light emitting modules described above, but other implementations are also possible. For example, the second reference minimum value $2^{nd}$ PMn may be a minimum value of another light emitting module other than the auxiliary first class light emitting modules.

Coordinates in which the minimum values of the forward voltages of the strings are within a range of the second reference minimum value $2^{nd}$ PMn and a value obtained by adding the second reference minimum value $2^{nd}$ PMn to a required spec dvf, and the maximum values of the forward voltages of the strings are within the range of the second reference minimum value $2^{nd}$ PMn and the value obtained by adding the second reference minimum value to the required spec dvf are classified as a third class. This is expressed in an equation as follows:

$$<2^{nd} \text{PMn}, 2^{nd} \text{PMn dvf}>.$$

A coordinate range indicated by the above equation has a square shape, but since the maximum value is greater than the minimum value in a same light emitting module, it may be displayed as a right triangle region indicated by a thick line in FIG. 7, and light emitting modules within this triangle range are classified as the third class. The light emitting modules within this triangular range may be packaged together since a difference between the minimum value and the maximum value in any combination of the left light emitting module 20L and the right light emitting module 20R does not exceed the required spec dvf. For convenience, the triangle including the third class light emitting modules is referred to as a third class triangle.

A same number of left light emitting modules 20L and right light emitting modules 20R may be included in the third class triangle, or they may be included in different numbers. In a case that the same number of left light emitting modules 20L and right light emitting modules 20R are included in the above third class triangle, they may all constitute a set and packaged together, and may be all classified as a main third class.

Meanwhile, in a case that different numbers of left light emitting modules 20L and right light emitting modules 20R are included in the third class triangle, an additional quantity of a larger number of light emitting modules among the left light emitting modules 20L and the right light emitting modules 20R are taken. The additional quantity of light emitting modules may be taken from light emitting modules having relatively large minimum values after the minimum values are aligned. Remaining light emitting modules excluding this additional quantity of light emitting modules may be classified as the main third class and packaged together, and this additional quantity of light emitting modules may be classified as an auxiliary third class. The light emitting modules classified as the main third class may constitute a set within the third class triangle, but the light emitting modules classified as the auxiliary third class cannot constitute a set because they are not matched within the third class triangle.

The light emitting modules classified as the auxiliary third class may include the light emitting modules classified as the auxiliary first class. The light emitting modules may be classified to have a plurality of auxiliary classes. Light emitting modules having the plurality of auxiliary classes may be packaged together in a main class of a same class as that of the auxiliary class, and thus, when a defect occurs due to a different factor among the light emitting modules packed in the same main class, a light emitting module having the same auxiliary class as the main class may replace a defective light emitting module.

A next classification is performed for the remaining light emitting modules excluding the light emitting modules classified as the main third class. The light emitting modules classified as the auxiliary third class are also included as target light emitting modules in the next classification.

(Classification of a Main Fourth Class and an Auxiliary Fourth Class)

Excluding the main second class light emitting modules, a largest forward voltage among the forward voltages Vf of entire strings S1, S2, and S3 of the target light emitting modules 20L and 20R is determined as a second reference maximum value $2^{nd}$ PMx. As shown in FIGS. 5 and 7, a maximum value of coordinates P4 becomes the second reference maximum value $2^{nd}$ PMx. The second reference maximum value $2^{nd}$ PMx may be a largest maximum value among the maximum values of the auxiliary second class light emitting modules described above, but other implementations are also possible. For example, the second reference maximum value $2^{nd}$ PMx may be a maximum value of another light emitting module other than the auxiliary second class light emitting modules.

Coordinates in which the minimum values of the forward voltages of the strings are within a range of the second reference maximum value $2^{nd}$ PMx and a value obtained by subtracting a required spec dvf from the second reference maximum value, and the maximum values of the forward voltages of the strings are within the range of the second reference maximum value $2^{nd}$ PMx and the value obtained by subtracting the required spec dvf from the second reference maximum value are classified as a fourth class. This is expressed in an equation as follows:

$$<2^{nd} \text{PMx}-\text{dvf}, 2^{nd} \text{PMx}>.$$

A coordinate range indicated by the above equation may be displayed as a right triangle region indicated by a dotted line in FIG. 7, and light emitting modules within this triangle range are classified as the fourth class. The light emitting modules within this triangular range may be packaged together since a difference between the minimum value and the maximum value in any combination of the left light emitting module 20L and the right light emitting module 20R does not exceed the required spec dvf. For convenience, a triangle including the fourth light emitting modules is referred to as a fourth class triangle.

A same number of left light emitting modules 20L and right light emitting modules 20R may be included in the fourth class triangle, or they may be included in different numbers. In a case that the same number of left light emitting modules 20L and right light emitting modules 20R are included in the above fourth class triangle, they may all constitute a set and packaged together, and may be all classified as a main fourth class.

Meanwhile, in a case that different numbers of left light emitting modules 20L and right light emitting modules 20R are included in the fourth class triangle, an additional quantity of a larger number of light emitting modules among the left light emitting modules 20L and the right light emitting modules 20R are taken. The additional quantity of light emitting modules may be taken from light emitting modules having relatively small maximum values after the maximum values are aligned. Remaining light emitting modules excluding this additional quantity of light emitting modules may be classified as the main fourth class and packaged together, and this additional quantity of light emitting modules may be classified as an auxiliary fourth class. The light emitting modules classified as the main fourth class may constitute a set within the fourth class triangle, but the light emitting modules classified as the auxiliary fourth class cannot constitute a set because they are not matched within the fourth class triangle.

The light emitting modules classified as the auxiliary fourth class may include the light emitting modules classified as the auxiliary second class. As described above, the light emitting modules may be classified to have a plurality of auxiliary classes. Light emitting modules having the plurality of auxiliary classes may be packaged together in a main class of a same class as that of the auxiliary class, and thus, when a defect occurs due to a different factor among the light emitting modules packed in the same main class, a light emitting module having the same auxiliary class as the main class may replace a defective light emitting module.

A next classification is performed for the remaining light emitting modules excluding the light emitting modules classified as the main fourth class. The light emitting modules classified as the auxiliary fourth class are also included as target light emitting modules in the next classification.

(Classification of a Main Fifth Class and an Auxiliary Fifth Class)

Excluding the main first class and the main third class light emitting modules, a smallest forward voltage among forward voltages Vf of entire strings S1, S2, and S3 of the target light emitting modules 20L and 20R is determined as a third reference minimum value $3^{rd}$ PMn. As shown in FIGS. 5 and 8, a minimum value of coordinates P5 becomes the third reference minimum value $3^{rd}$ PMn. The third reference minimum value $3^{rd}$ PMn may be a smallest minimum value among the minimum values of the auxiliary third class light emitting modules described above, but other implementations are also possible. For example, the third reference minimum value $3^{rd}$ PMn may be a minimum value of another light emitting module other than the auxiliary third class light emitting modules.

Coordinates in which the minimum values of the forward voltages of the strings are within a range of the third reference minimum value $3^{rd}$ PMn and a value obtained by adding the third reference minimum value $3^{rd}$ PMn to a required spec dvf, and the maximum values of the forward voltages of the strings are within the range of the third reference minimum value $3^{rd}$ PMn and the value obtained by adding the third reference minimum value to the required spec dvf are classified as a fifth class. This is expressed in an equation as follows:

$$<3rd\ PMn, 3rd\ PMn\ dvf>.$$

A coordinate range indicated by the above equation may be displayed as a right triangle region indicated by a thick line in FIG. 8, and light emitting modules within this triangle range are classified as the fifth class. The light emitting modules within this triangular range may be packaged together since a difference between the minimum value and the maximum value in any combination of the left light emitting module 20L and the right light emitting module 20R does not exceed the required spec dvf. For convenience, a triangle including the fifth class light emitting modules is referred to as a fifth class triangle.

A same number of left light emitting modules 20L and right light emitting modules 20R may be included in the fifth class triangle, or they may be included in different numbers. In a case that the same number of left light emitting modules 20L and right light emitting modules 20R are included in the above fifth class triangle, they may all constitute a set and packaged together, and may be all classified as a main fifth class.

Meanwhile, in a case that different numbers of left light emitting modules 20L and right light emitting modules 20R are included in the fifth class triangle, an additional quantity of a larger number of light emitting modules among the left light emitting modules 20L and the right light emitting modules 20R are taken. The additional quantity of light emitting modules may be taken from light emitting modules having relatively large minimum values after the minimum values are aligned. Remaining light emitting modules excluding this additional quantity of light emitting modules may be classified as the main fifth class and packaged together, and this additional quantity of light emitting modules may be classified as an auxiliary fifth class. The light emitting modules classified as the main fifth class may constitute a set within the fifth class triangle, but the light emitting modules classified as the auxiliary fifth class cannot constitute a set because they are not matched within the fifth class triangle.

The light emitting modules classified as the auxiliary fifth class may include the light emitting modules classified as the auxiliary first class and/or the auxiliary third class.

(Classification of a Main Sixth Class and an Auxiliary Sixth Class)

Excluding the main second class and the main fourth class light emitting modules, a largest forward voltage among the forward voltages Vf of entire strings S1, S2, and S3 of the target light emitting modules 20L and 20R is determined as a third reference maximum value $3^{rd}$ PMx. As shown in FIGS. 5 and 8, a maximum value of coordinates P6 becomes the third reference maximum value $3^{rd}$ PMx. The third reference maximum value $3^{rd}$ PMx may be a largest maximum value among the maximum values of the auxiliary second fourth light emitting modules described above, but other implementations are also possible. For example, the third reference maximum value $3^{rd}$ PMx may be a maximum value of another light emitting module other than the auxiliary fourth class light emitting modules.

Coordinates in which the minimum values of the forward voltages of the strings are within a range of the third reference maximum value $3^{rd}$ PMx and a value obtained by subtracting a required spec dvf from the third reference maximum value, and the maximum values of the forward voltages of the strings are within the range of the third reference maximum value $3^{rd}$ PMx and the value obtained by subtracting the required spec dvf from the third reference maximum value are classified as a sixth class. This is expressed in an equation as follows:

$$<3rd\ PMx-dvf, 3rd\ PMx>.$$

A coordinate range indicated by the above equation may be displayed as a right triangle region indicated by a dotted line in FIG. 8, and light emitting modules within this triangle range are classified as the sixth class. The light emitting modules within this triangular range may be packaged together since a difference between the minimum value and the maximum value in any combination of the left light emitting module 20L and the right light emitting module 20R does not exceed the required spec dvf. For convenience, a triangle including the sixth class light emitting modules is referred to as a sixth class triangle.

A same number of left light emitting modules 20L and right light emitting modules 20R may be included in the sixth class triangle, or they may be included in different numbers. In a case that the same number of left light emitting modules 20L and right light emitting modules 20R are included in the above sixth class triangle, they may all constitute a set and packaged together, and may be all classified as a main sixth class.

Meanwhile, in a case that different numbers of left light emitting modules 20L and right light emitting modules 20R are included in the sixth class triangle, an additional quantity of a larger number of light emitting modules among the left light emitting modules 20L and the right light emitting modules 20R are taken. The additional quantity of light emitting modules may be taken from light emitting modules having relatively small maximum values after the maximum values are aligned. Remaining light emitting modules excluding this additional quantity of light emitting modules may be classified as the main sixth class and packaged together, and this additional quantity of light emitting modules may be classified as an auxiliary sixth class. The light emitting modules classified as the main sixth class may constitute a set within the sixth class triangle, but the light emitting modules classified as the auxiliary sixth class cannot constitute a set because they are not matched within the sixth class triangle.

The light emitting modules classified as the auxiliary sixth class may include the light emitting modules classified as the auxiliary second class and/or the auxiliary fourth class.

A next classification is performed for the remaining light emitting modules excluding the light emitting modules classified as the main sixth class, and a fourth reference minimum value and a fourth reference maximum value are also determined, and main and auxiliary classes may be sequentially classified based on these. This classification may proceed until all light emitting modules that can be packaged together are classified. When the left light emitting modules 20L and the right light emitting modules 20R are all classified and packaged in a same number, there will be no remaining light emitting modules that cannot constitute a set. In contrast, when some of the left light emitting modules 20L and the right light emitting modules 20R remain without constituting a set, surplus light emitting modules generally have coordinate values near a region indicated by a dotted line ellipse.

The surplus light emitting modules, that is, light emitting modules that cannot finally constitute a set have at least one auxiliary class that matches a main class, and thus, when a defect occurs among light emitting modules that have already constituted a set, a defective light emission module may be replaced.

Since the embodiments of the present disclosure classify light emitting modules by mixing an upward classification from the first reference minimum value and a downward classification from the first reference maximum value, the surplus light emitting modules are generally located in a central region with a high coordinate frequency in a graph. The light emitting modules located in this region are highly likely to have a plurality of auxiliary classes, and thus, when a defect occurs in light emitting modules to be classified into main classes and packaged together, defective light emitting modules of various main classes may be easily replaced using the surplus light emitting modules.

In the previous embodiment, a method of alternately performing the upward classification and the downward classification has been exemplarily described. That is, the light emitting modules have been classified by performing the upward classification for the first, third, and fifth classes, and the downward classification for the second, fourth, and sixth classes. However, other implementations are also possible. For example, the upward classification and the downward classification may be alternately performed in an order of the upward classification first and the downward classification later, or two or more downward classifications or two or more upward classifications may be performed consecutively. However, in the embodiments of the present disclosure, the upward classification and the downward classification are performed at least once, respectively. Accordingly, the minimum value of the forward voltages of the light emitting modules that do not finally constitute a set is greater than the first reference minimum value and the maximum value thereof is less than the first reference maximum value.

Although the classification method of the light emitting modules constituting the backlight light source for the display apparatus has been described in the previous embodiment, the present disclosure is not limited to the classification method of the light emitting modules constituting the backlight light source, but may be applied to various classification methods of light emitting modules two or more of which constitute a light source as a set.

Figure 9A:
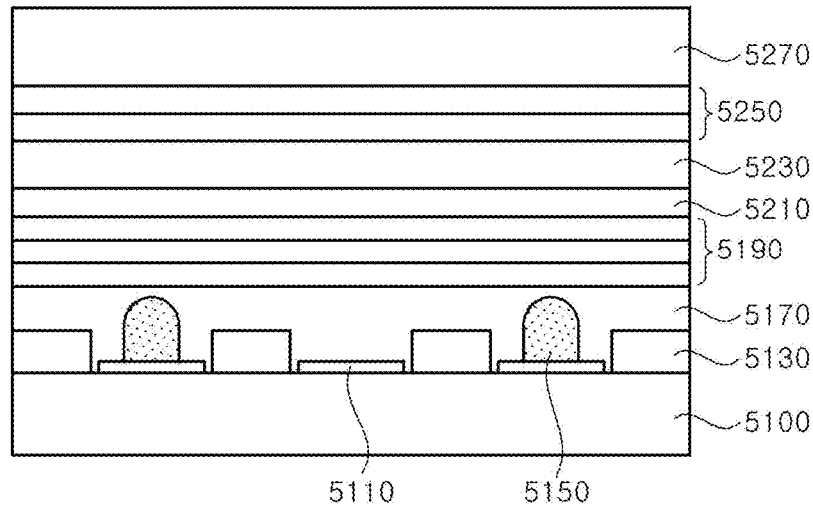
FIGS. 9A, 9B, and 9C are s schematic cross-sectional view, a plan view, and a circuit diagram illustrating a display apparatus according to another embodiment of the present disclosure.
Figure 9B:
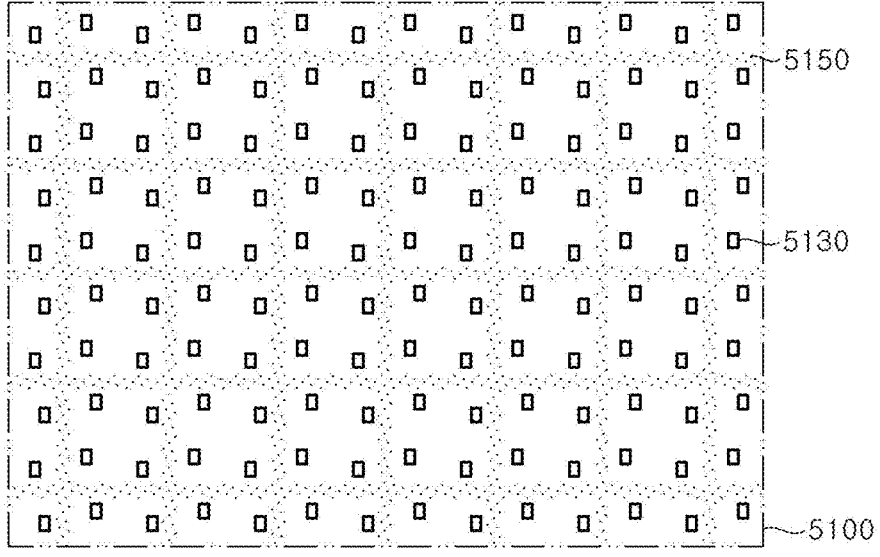
Figure 9C:
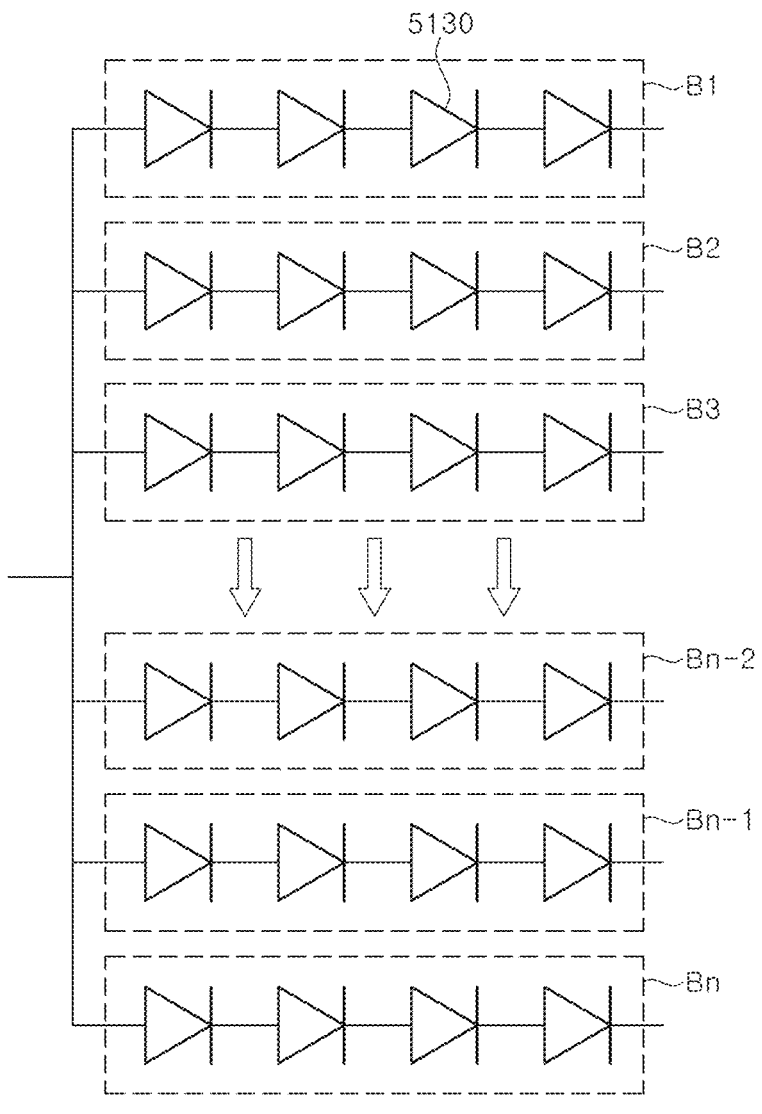

In particular, although an edge-type backlight light source has been exemplarily described, the present disclosure may also be applied to a direct-type backlight light source, and an embodiment of the direct-type backlight light source will be described below. FIGS. 9A, 9B, and 9C are a schematic cross-sectional view, a plan view, and a circuit diagram illustrating a display apparatus according to another embodiment of the present disclosure, respectively. FIG. 9A is a partial cross-sectional view of the display apparatus, FIG. 9B is a partial plan view of a light emitting module, and FIG. 9C is a circuit diagram of the light emitting module.

Referring to FIGS. 9A, 9B, and 9C, the display apparatus according to the present embodiment includes a display panel 5270 and a backlight light source providing light to the display panel 5270.

The display panel 5270 is not particularly limited, and may be, for example, a liquid crystal display panel including a liquid crystal layer. A gate driving PCB for supplying a driving signal to a gate line may be further disposed at an edge of the display panel 5270. Herein, the gate driving PCB may not be formed on an additional PCB, but may be formed on a thin film transistor substrate.

The backlight light source may include a plurality of light emitting modules, and each of the light emitting modules may include a circuit board 5100, a reflection unit 5110, light emitting devices 5130, a reflection wall 5150, a molding member 5170, and a diffusion film 5190, a blue light transmittance (BLT) film 5210, a quantum dot (QD) film 5230, and a brightness enhancement film 5250.

As shown in FIG. 9A, the reflection unit 5110 may be disposed on a surface of the circuit board 5100. The reflection unit 5110 may be provided as a reflection sheet or may be coated on the circuit board 5100. The reflection unit 5110 may surround the light emitting devices 5130 by being formed around a region where the light emitting devices 5130 are mounted. However, other implementations are also possible. For example, the light emitting devices 5130 may be disposed on the reflection unit 5110.

The circuit board 5100 has circuits for supplying power to the light emitting devices 5130. The light emitting devices 5130 may be connected in series, parallel, or series-parallel through the circuits formed on the circuit board 5100. An electrical connection structure of the light emitting devices 5130 will be described later with reference to FIG. 9C.

The reflection wall 5150 is formed on the circuit board 5100. The reflection wall 5150 divides a region on the circuit board 5100 into a plurality of blocks, as shown in FIG. 9B. A plurality of light emitting devices 5130 may be disposed in each of the blocks. For example, in this embodiment, four light emitting devices 5130 are disposed in each of the blocks. However, other implementations are also possible. For example, more or fewer light emitting devices 5130 than four may be disposed in each of the blocks.

The reflection wall 5150 may include a reflective material that reflects light generated from the light emitting devices 5130, and may be formed of or include, for example, white silicone.

The molding member 5170 fills the blocks partitioned by the reflection wall 5150. The molding member 5170 may be formed of or include transparent silicone. The reflection wall 5150 and the molding member 5170 may include silicone of a same series, and may be formed of or include, for example, phenyl or methyl. Since the reflection wall 5150 and the molding member 5170 include the same type of silicone, a bonding strength between the molding member 5170 and the reflection wall 5150 may be improved.

The diffusion film 5190 is disposed on the molding member 5170. The diffusion film 5190 diffuses light generated from the light emitting devices 5130 to evenly diffuse light. The diffusion film 5190 may adhere to the molding member 5170, without being limited thereto, and may be spaced apart from the molding member 5170. The diffusion film 5190 may consist of one sheet, or may consist of a plurality of sheets as shown in FIG. 9A.

The BLT film 5210 and the QD film 5230 may be disposed on the diffusion film 5190. The QD film 5230 includes quantum dots that convert light emitted from the light emitting devices 5130, for example, blue light, into green light and red light.

The BLT film 5210 transmits light emitted from the light emitting devices 5130, for example, blue light, and reflects green light and red light generated from the QD film 5230. Accordingly, it is possible to prevent green light and red light generated from the QD film 5230 from being lost while proceeding toward the circuit board 5100.

Meanwhile, the brightness enhancement film 5250 is disposed on the QD film 5230 to improve a brightness of light proceeding to the display panel 5270. The brightness enhancement film 5250 may include lower and upper brightness enhancement films, and may further include a dual brightness enhancement film (DBEF).

As shown in FIG. 9B, the light emitting devices 5130 are disposed in the blocks partitioned by the reflection wall 5150. The light emitting devices 5130 in a same block may be spaced apart from one another at an equal interval. In addition, the light emitting devices 5130 in adjacent blocks may also be spaced apart at a similar interval. As shown in FIG. 9B, the light emitting devices in one block may be arranged in a tilted shape with respect to a rectangular block.

Meanwhile, as shown in FIG. 9C, the light emitting devices 5130 arranged in each of blocks B1 through Bn may be connected in series to one another to form a string. A maximum voltage difference between each string may be, for example, 1.5V or less. That is, a maximum difference between a forward voltage of the light emitting devices 5130 disposed in a region surrounded by the reflection wall 5150 may be 1.5V or less.

In addition, anodes of the light emitting devices in first to nth blocks may be connected to one another, and cathodes thereof may be spaced apart from one another. For example, anodes of the light emitting devices in the first block B1 and anodes of the light emitting devices in a second block B2 are connected to one another, and cathodes of the light emitting devices in the first block B1 and cathodes of the light emitting devices of the second block B2 are electrically spaced apart from one another. Accordingly, the light emitting devices 5130 may be independently driven in units of blocks.

According to this embodiment, since the light emitting devices 5130 are independently driven in block units, and for example, a black region may be implemented by turning off the light emitting devices 5130. Therefore, a contrast may be implemented more clearly, and a power consumption may be reduced compared to a conventional LCD display in which a backlight light source is always turned on. Furthermore, by using the QD film, vivid colors may be implemented.

Even for a direct-type backlight source in which the plurality of light emitting modules constitutes one set, the light emitting modules may be manufactured in larger quantities and then classified in the same manner as described above.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

The invention claimed is:

1. A display apparatus, comprising:
a display panel; and
a backlight source providing light to the display panel,
wherein the backlight source includes first and second light emitting modules disposed near one side surface of the display panel,
each of the first and second light emitting modules, comprising:
a circuit board;
a plurality of light emitting devices disposed on the circuit board; and
a reflector disposed on the circuit board,
wherein the plurality of light emitting devices forms one or more strings,
wherein light emitting devices in one string are connected in series,
wherein a maximum forward voltage difference between the first light emitting module and the second light emitting module is 1.5V or less, and
wherein a thickness of a first portion of the reflector disposed between two adjacent grooves in a string is greater than that of a second portion of the reflector disposed at an edge of the string.

2. The display apparatus of claim 1,
wherein the one or more strings are connected to each other in parallel.

3. The display apparatus of claim 2,
wherein a maximum forward voltage difference between two of the one or more strings in the first and second light emitting modules is 1.5V or less.

4. The display apparatus of claim 1,
wherein the reflector include reflection walls, and one of the reflection walls surrounding light emitting devices in one string is spaced apart from another one of the reflection walls surrounding light emitting devices in another string.

5. The display apparatus of claim 4,
wherein each of the reflection walls includes a plurality of grooves, and at least two light emitting devices are disposed in each of the plurality of grooves.

6. The display apparatus of claim 4,
wherein a height of one of the reflection walls is greater than a height of the plurality of light emitting devices.

7. The display apparatus of claim 1,
wherein a distance between the second portion of the reflector and a first light emitting device in a groove closest to the second portion of the reflector is smaller than a distance between the first portion of the reflector and a second light emitting device in the groove.

* * * * *